(12) United States Patent
Liao

(10) Patent No.: US 7,264,487 B2
(45) Date of Patent: *Sep. 4, 2007

(54) ELECTRICAL CONNECTOR ASSEMBLY WITH PICK UP CAP

(75) Inventor: Fang-Jwu Liao, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 59 days.

This patent is subject to a terminal disclaimer.

(21) Appl. No.: 10/886,113

(22) Filed: Jul. 6, 2004

(65) Prior Publication Data

US 2005/0003683 A1 Jan. 6, 2005

(30) Foreign Application Priority Data

Jul. 4, 2003 (TW) ............................... 92212388 U

(51) Int. Cl.
*H01R 13/44* (2006.01)
(52) U.S. Cl. ...................................... 439/135; 439/940
(58) Field of Classification Search ................ 439/135, 439/41, 940
See application file for complete search history.

(56) References Cited

U.S. PATENT DOCUMENTS

| 5,073,116 | A | * | 12/1991 | Beck, Jr. ...................... 439/71 |
| 5,530,202 | A | * | 6/1996 | Dais et al. ................... 174/385 |
| 6,015,305 | A | * | 1/2000 | McHugh et al. ............ 439/135 |
| 6,146,155 | A | * | 11/2000 | Boling et al. ................. 439/79 |
| 6,413,111 | B1 | * | 7/2002 | Pickles et al. .............. 439/342 |
| 6,533,592 | B1 | * | 3/2003 | Chen et al. ................. 439/135 |
| 6,629,363 | B1 | * | 10/2003 | Chan ........................... 29/832 |
| 6,927,339 | B2 | * | 8/2005 | Murr et al. ..................... 174/66 |
| 2005/0009377 | A1 | * | 1/2005 | Liao ............................. 439/41 |
| 2005/0032397 | A1 | * | 2/2005 | Huang .......................... 439/41 |
| 2005/0090134 | A1 | * | 4/2005 | Liao et al. .................. 439/135 |
| 2005/0090136 | A1 | * | 4/2005 | Liao et al. .................. 439/331 |

* cited by examiner

*Primary Examiner*—Neil Abrams
(74) *Attorney, Agent, or Firm*—Wei Te Chung

(57) ABSTRACT

An electrical connector assembly (1) includes an LGA connector (2) having a metal clip (25) and a pick up cap (3). The pick up cap has a planar body (30) forming a plane top surface (300). Several holes (302, 303, 309) are defined in the planar body. When the pick up cap is engagingly mounted onto a top portion of the connector, the holes are in communication with a window (258) of the clip. A vacuum suction device can engage the top surface of the pick up cap to move the connector assembly to a desired location on a PCB. When curing adhesive film at high temperature, heated air can flow through the holes to a bottom portion of the connector. Reliable electrical connection between the contacts of the connector and the metal contact pads of the PCB is subsequently produced in a wave solder machine or drag soldering equipment.

11 Claims, 5 Drawing Sheets

ELECTRICAL CONNECTOR ASSEMBLY WITH PICK UP CAP

CROSS-REFERENCE TO RELATED APPLICATION

The present invention is related to a co-pending U.S. Pat. No. 6,877,990 B2 filed on Jul. 3, 2003, entitled "LAND GRID ARRAY CONNECTOR ASSEMBLY WITH PICK UP CAP," invented by Fang-Jwu Liao, and assigned to the same assignee as the present invention.

BACKGROUND OF THE INVENTION

1. Field of the Invention

The present invention relates to an electrical connector assembly which comprises an electrical connector and a pick up cap, the pick up cap being mounted to the connector for providing a plane top surface to be engaged by a vacuum suction device, whereby the connector assembly can be moved onto a circuit substrate such as a printed circuit board (PCB) on which the connector is to be mounted.

2. Description of the Related Art

On many production lines, electronic components such as electrical connectors are mounted onto circuit substrates such as printed circuit boards (PCBs) by surface mount technology (SMT), as disclosed in U.S. Pat. Nos. 5,615,477 and 4,916,805.

A method of mounting an electrical connector onto a PCB by SMT generally comprises a sequence of the following steps A through F:

A—Application of an adhesive film on the PCB having a plurality of metal contact pads. The application of the adhesive film may be performed by screen printing, pin transfer, or from a dispenser onto predetermined areas of the PCB.

B—Activation of the adhesive film by irradiation with actinic light in the ultraviolet (UV) or visible wavelength range between 200 and 600 nm, to a degree and for a period of time such that a desired initial tackiness is produced.

C—Mounting the connector with its contacts on the activated adhesive film and the metal contact pads of the PCB.

D—Curing the adhesive film at a temperature between 60~140° C.; for example, in a convection cabinet, using infrared radiant heaters or by means of the actinic radiation source used in step B if such source also produces infrared radiation.

E—Producing electrical engagement between the contacts of the connector and the corresponding metal contact pads of the PCB by soldering in a wave solder machine or in drag soldering equipment;

F—Cooling the assembly to room temperature.

In step C, the connector is accurately positioned on the PCB by means of a vacuum suction device. Generally, a typical connector has a multiplicity of holes in a flat top portion thereof. Thus the connector does not have a suitably smooth, integral top surface for engagement by a vacuum suction device. Typically, a pick up cap is attached on the top portion of the connector to provide the required plane top surface. Such pick up caps are disclosed in U.S. Pat. Nos. 6,413,111, 6,478,588, 6,533,592, 6,547,609, 6,561,825 and 6,572,383.

FIG. 6 is an isometric view of a related pick up cap 9 used in an land grid array (LGA) connector 8. The connector 8 comprises a generally rectangular insulative housing 81, a plurality of electrical contacts 82 received in the housing 81, a metal stiffener 83 partly covering and reinforcing the housing 81, a lever 84 pivotably received in an end of the stiffener 83, and a metal clip 85 pivotably mounted to an opposite end of the stiffener 83 for engaging with the lever 84. The pick up cap 9 has a substantially rectangular body portion 91. The body portion 91 has a plane top surface 910, and a bottom surface 911 opposite to the top surface 910. A pair of first clasps 92 is formed at opposite sides of a front end of the body portion 91 respectively, and a pair of spaced second clasps (not shown) is formed at a middle portion of a rear end of the body portion 91. Also referring to FIG. 7, the first clasps 92 and the second clasps snappingly clasp corresponding edges of the clip 85 of the connector 8. The pick up cap 9 is thereby securely mounted onto the connector. In this position, a vacuum suction device (not shown) can engage the top surface 910 of the pick up cap 9. The connector 8 can thus be moved to a desired location on a PCB (not shown), with the contacts 82 of the connector 8 engaged on an activated adhesive film and metal contact pads of the PCB. The contacts 82 are then soldered to the metal contact pads. When the entire assembly has cooled, the pick up cap 9 is detached from the connector 8. An electronic package such as an LGA central processing unit (CPU) (not shown) can then be mounted onto the connector 8. The connector 8 enables electrical connection between the CPU and the PCB.

However, the pick up cap 9 and the stiffener 83 cover the connector 8. When curing the adhesive film at high temperature in a convection cabinet using infrared radiant heaters, heated air can only flow through a gap between the top portion of the connector 8 and the clip 85 to a bottom portion of the connector 8. Generally, the time needed for curing the adhesive film is short. Thus, the adhesive film is liable to cure non-uniformly. When this happens, electrical engagement between some of the contacts 82 and the corresponding metal contact pads of the PCB may be flawed. The connector 8 may not reliably electrically connector the CPU and the PCB. Additionally, when cooling the entire assembly to room temperature, heated air can only be dissipated out through the gap between the top portion of the connector 8 and the clip 85. This increases the time needed for cooling the assembly, which reduces the efficiency of mounting of the connector 8 onto the PCB.

In view of the above, a new pick up cap that overcomes the above-mentioned disadvantages is desired.

SUMMARY OF THE INVENTION

Accordingly, an object of the present invention is to provide an electrical connector assembly which has an electrical connector and a pick up cap mounted on the connector, wherein the pick up cap is configured to facilitate efficient mounting of the connector and pick up cap onto a circuit substrate such as a printed circuit board (PCB).

To achieve the above-mentioned object, an electrical connector assembly in accordance with a preferred embodiment comprises a land grid array (LGA) connector and a pick up cap. The connector comprises an insulative housing, a plurality of electrical contacts received in the housing, and a metal clip having a generally rectangular window in a middle thereof. The housing defines a generally rectangular cavity for receiving an electronic package such as an LGA central processing unit (CPU) therein. A multiplicity of passageways is defined in a portion of the housing under the cavity, the passageways receiving a corresponding number of the contacts therein. The clip is disposed on the housing to press the CPU upon the contacts. The pick up cap is engagingly mounted onto the connector and has a generally rectangular planar body. The planar body has a plane top surface and a bottom surface opposite to the top surface. Two generally rectangular first holes are defined in each of opposite lateral sides of the planar body. Two generally rectangular second holes are defined in a front end of the planar body. Two generally rectangular third holes are defined in a rear end of the planar body. Each third hole is located nearer an outer side edge of the planar body than both corresponding second holes. Each second hole is larger than each of the first and second holes. When the pick up cap is engagingly mounted onto the connector, the first, second and third holes are in communication with the window of the clip. A vacuum suction device can engage the top surface of the pick up cap, to move the connector assembly to a desired location on a circuit substrate such as a printed circuit board (PCB). When curing the adhesive film at high temperature in a convection cabinet using infrared radiant heaters, heated air can flow through the first, second and third holes to a bottom portion of the connector, thereby quickly and uniformly curing the adhesive film. Accordingly, when the entire assembly is subsequently processed in a wave solder machine or drag soldering equipment, reliable electrical connection between the contacts of the connector and the metal contact pads of the PCB is produced. Furthermore, when said entire assembly is cooled, heated air can be quickly dissipated out through the first, second and third holes of the pick up cap. That is, said entire assembly can be quickly cooled. The efficiency of mounting of the connector onto the PCB is thereby enhanced.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
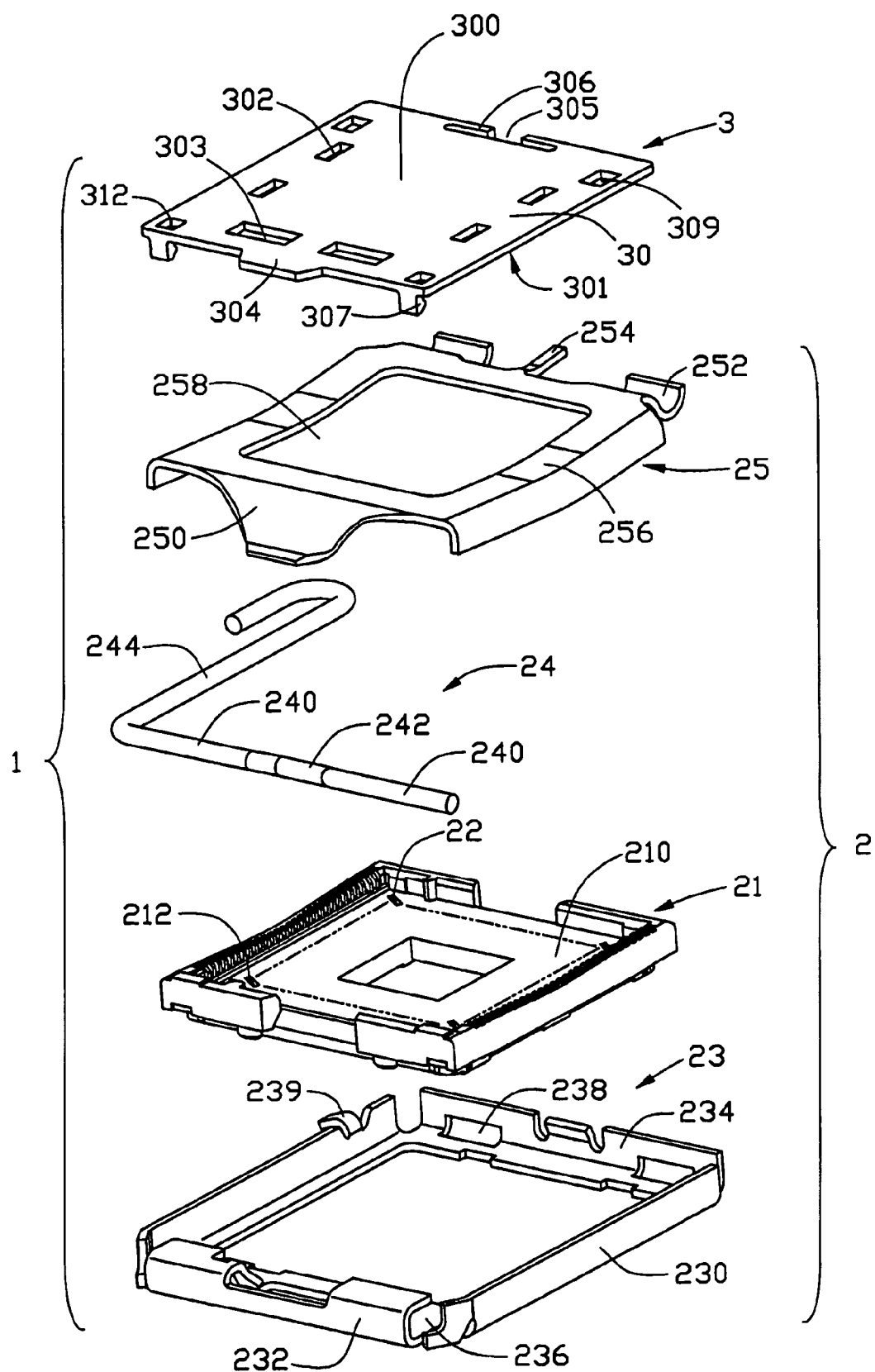
FIG. 1 is an exploded, isometric view of an electrical connector assembly in accordance with the preferred embodiment of the present invention, the connector assembly comprising an LGA connector and a pick up cap mounted onto the connector.

FIG. 1 is an exploded, isometric view of an electrical connector assembly 1 in accordance with the preferred embodiment of the present invention. The connector assembly 1 comprises a land grid array (LGA) connector 2 and a generally rectangular pick up cap 3. The pick up cap 3 is mounted onto the connector 2, for providing a plane top surface to be engaged by a vacuum suction device. The connector assembly 1 can thereby be moved onto a circuit substrate, such as a printed circuit board (PCB) (not shown), on which the connector 2 is to be mounted.

The connector 2 comprises a generally rectangular insulative housing 21, a plurality of electrical contacts 22 received in the housing 21, a metal stiffener 23 partly covering and reinforcing the housing 21, a lever 24 pivotably received in an end of the stiffener 23, and a metal clip 25 pivotably mounted to an opposite end of the stiffener 23 for engaging with the lever 24.

The housing 21 defines a generally rectangular cavity 210 in a middle thereof. The cavity 210 is used for receiving an electronic package such as an LGA central processing unit (CPU) (not shown) therein. A multiplicity of passageways 212 is defined in a portion of the housing 21 under the cavity 210, the passageways 212 receiving a corresponding number of the contacts 22 therein respectively. The stiffener 23 comprises a pair of lateral sides 230 each having an L-shaped cross-section, a front end 232 having a U-shaped cross-section, and a rear end 234 having an L-shaped cross-section. The housing 21 is fittingly received in the stiffener 23. An elongate chamber 236 is defined in the front end 232 of the stiffener 23. A pair of spaced slots 238 is defined in the rear end 234 of the stiffener 23. An ear 239 extends arcuately from an edge of one of the lateral sides 230 of the stiffener 23. The lever 24 comprises a pair of locating portions 240 pivotably received in the chamber 236 of the stiffener 23, an offset actuating portion 242 between the locating portions 240, and an operating portion 244 extending perpendicularly from an end of one of the locating portions 240. The operating portion 244 is disposed outside of the stiffener 23. When oriented at a horizontal position parallel to a top face of the housing 21, the operating portion 244 engages with the ear 239. The clip 25 comprises a pair of parallel arcuate sides 256. A generally rectangular window 258 is defined in a middle of the clip 25. An engaging portion 250 extends arcuately from a front end of the clip 25. A pair of spaced securing portions 252 extends arcuately from an opposite rear end of the clip 25, the securing portions 252 being pivotably received in the slots 238 of the stiffener 23. A tail 254 extends from the rear end of the clip 25, between the securing portions 252. When the clip 25 is oriented at a horizontal position parallel to the top face of the housing 21, the engaging portion 250 of the clip 25 is engaged by the actuating portion 242 of the lever 24, with the clip 25 thereby pressing the CPU on the contacts 22. When the clip 25 is oriented at a position perpendicular to the top face of the housing 21, the tail 254 abuts against the stiffener 23 to prevent the clip 25 from being over-rotated.

The pick up cap 3 has a generally rectangular planar body 30. The planar body 30 comprises a plane top surface 300, and a bottom surface 301 opposite to the top surface 300. Two generally rectangular first holes 302 are defined in each of opposite lateral sides of the planar body 30. Two generally rectangular second holes 303 are defined in a front end of the planar body 30. Two spaced, generally rectangular third holes 309 are defined in a rear end of the planar body 30. Each third hole 309 is located nearer an outer side edge of the planar body 30 than both corresponding second holes 302. Each second hole 303 is larger than each of the first and second holes 302, 309. A trapezoidal lip 304 is formed at a middle of the front end of the planar body 30. A generally T-shaped channel 305 is defined in a middle of the rear end of the planar body 30, thereby forming a pair of opposing arms 306.

Figure 2:
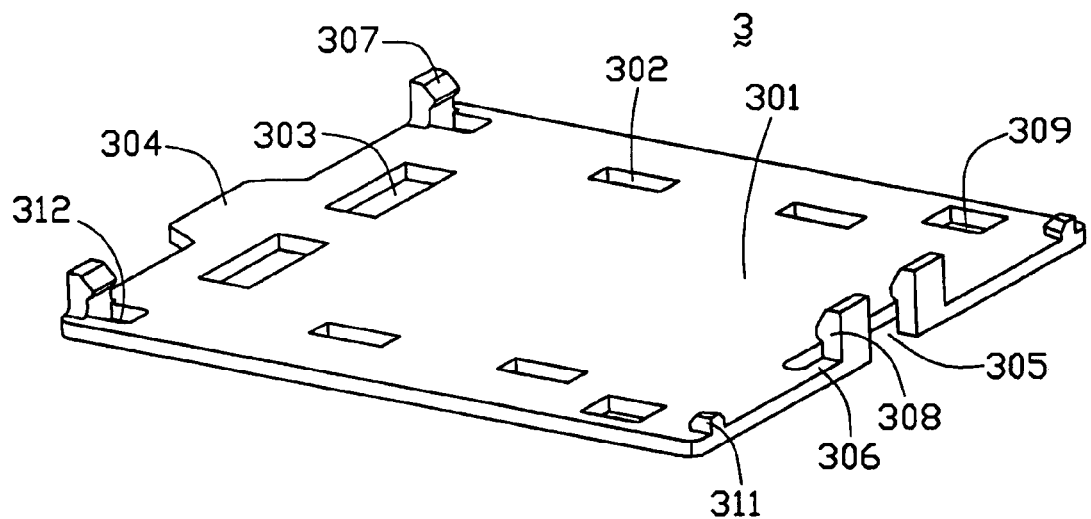
FIG. 2 is an enlarged, isometric view of the pick up cap of FIG. 1, but showing the pick up cap inverted.

FIG. 2 is an isometric view of the pick up cap 3 inverted. A pair of first clasps 307 is formed at opposite sides of the front end of the planar body 30 respectively. The first clasps 307 depend from the bottom surface 301 of the planar body 30. A through opening 312 is defined in a portion of the planar body 30 adjacent a rear of each first clasp 307. The opening 312 is disposed in a vertical direction perpendicular to the planar body 30, for use with during molding to form the clasp 307. A pair of second clasps 308 is formed at the rear end of the planar body 30. The second clasps 308 depend from free ends of the arms 306 respectively. A pair of protrusions 311 is formed at opposite sides of the rear end of the planar body 30 respectively. The protrusions 311 depend from the bottom surface 301.

Figure 3:
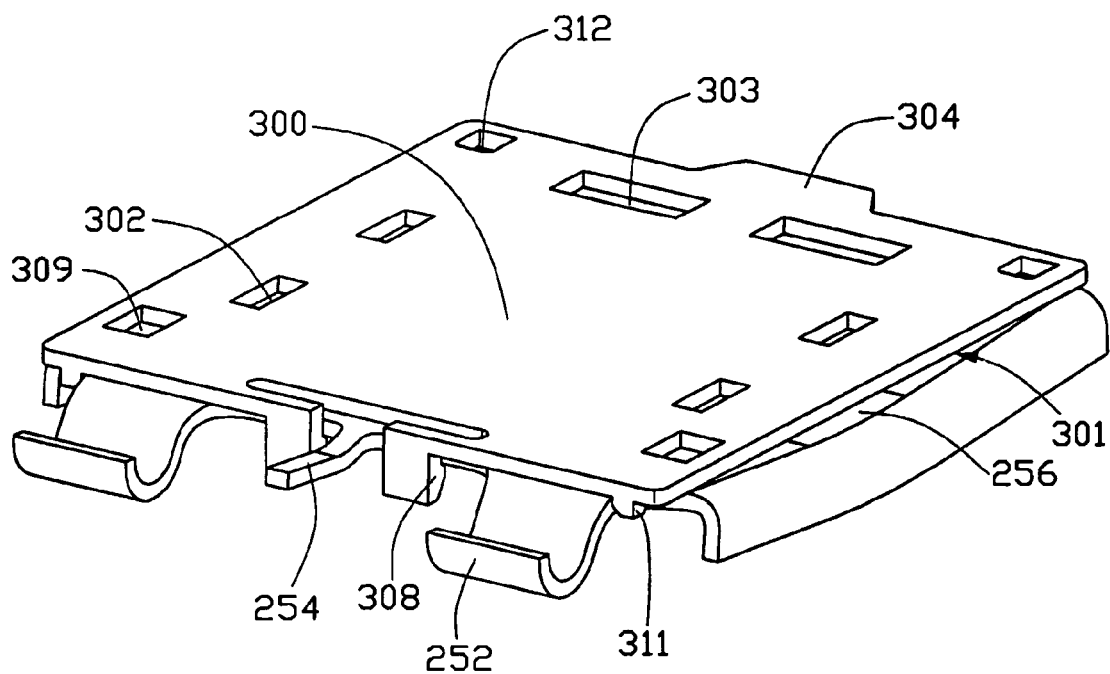
FIG. 3 is an enlarged, assembled view of the pick up cap and a clip of the connector of FIG. 1, but viewed from another aspect.
Figure 4:
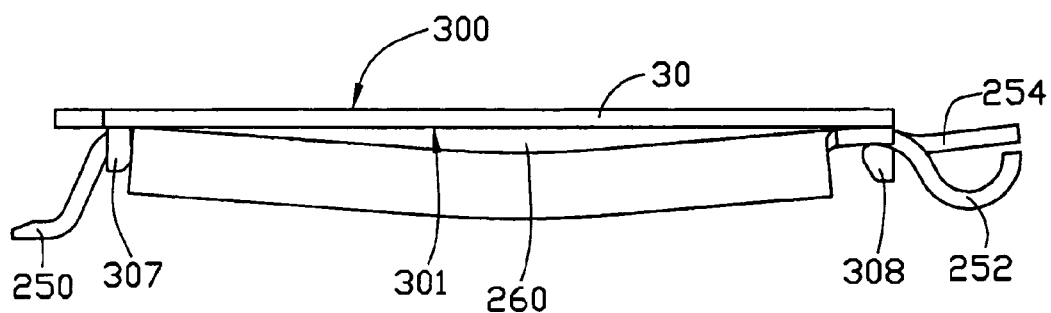
FIG. 4 is a side elevation view of the pick up cap and the clip of FIG. 3.
Figure 5:
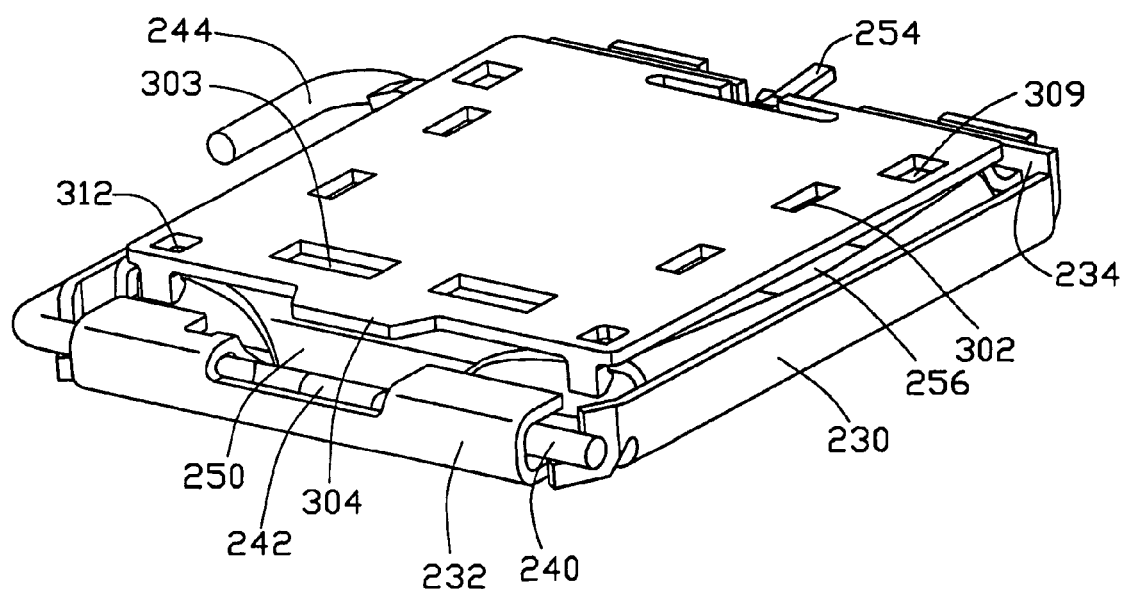
FIG. 5 is an enlarged, assembled view of FIG. 1.
Figure 6:
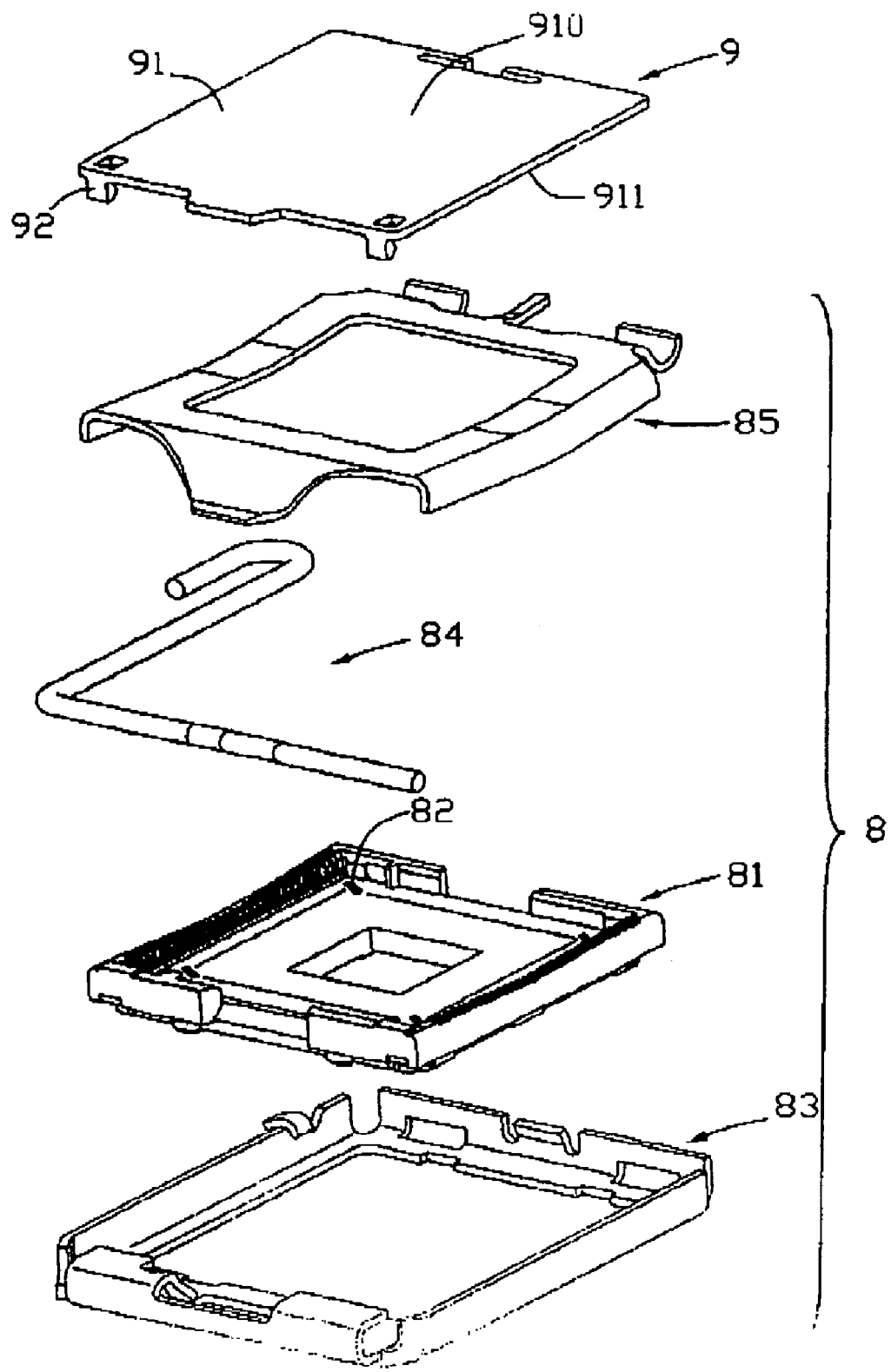
FIG. 6 is an exploded, isometric view of a related LGA connector assembly with pick up cap.
Figure 7:
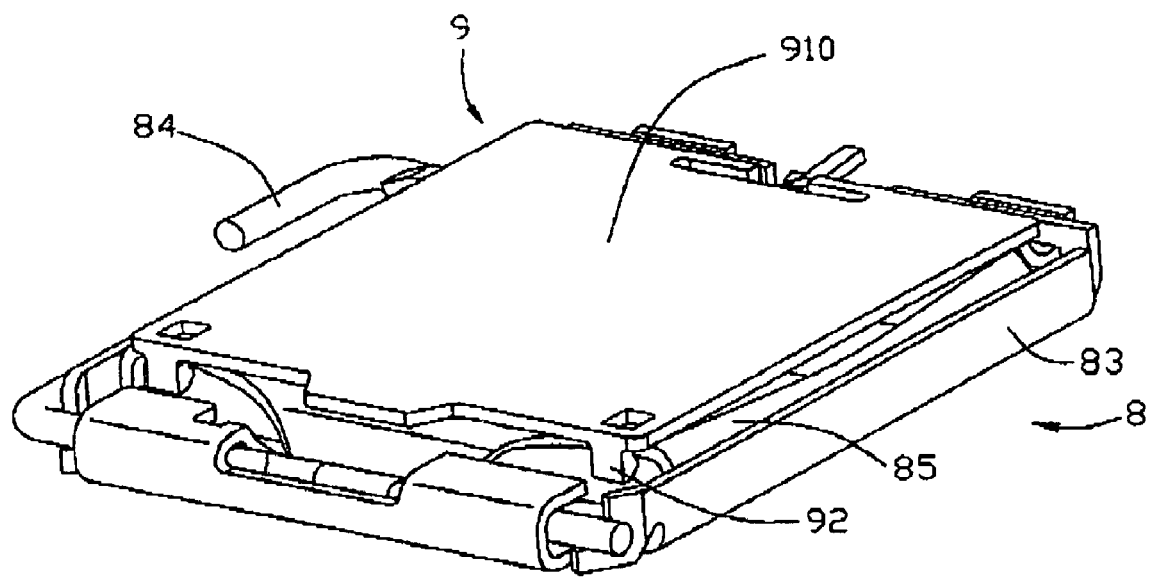
FIG. 7 is an enlarged, assembled view of FIG. 6.

Referring to FIG. 3, in attachment of the pick up cap 3 onto the connector 2, the pick up cap 3 is disposed over the connector 2, with the first and second clasps 307, 308 loosely contacting corresponding front and rear edges of the clip 25 respectively. The pick up cap 3 is pressed down. The first clasps 307 and second clasps 308 are elastically deflected outwardly, and snappingly clasp the front and rear edges of the clip 25. Simultaneously, the protrusions 311 abut against the rear edge of the clip 25. The pick up cap 3 is thereby securely mounted onto the connector 2. The channel 305 receives the tail 254 of the clip 25. FIG. 4 is an assembled, side elevation view of the pick up cap 3 and the clip 25. A gap 260 is formed between the bottom surface 301 of the pick up cap 3 and the arcuate sides 256 of the clip 25. The first, second and third holes 302, 303, 309 are in communication with the window 258 of the clip 25. In this position, a vacuum suction device (not shown) can reliably engage a middle portion of the top surface 300 of the pick up cap 3. The connector assembly 1 can thus be moved to a desired location on the PCB, with the contacts 22 of the connector 2 engaged on an activated adhesive film and metal contact pads of the PCB.

The adhesive film is cured at high temperature in a convection cabinet using infrared radiant heaters. Heated air can flow not only through the gap 260, but also through the first, second and third holes 302, 303, 309 of the pick up cap 3, the window 258 of the clip 25, and the passageways 212 of the housing 21. Thus much heated air can quickly flow to a bottom portion of the connector 2, and quickly and uniformly cure the adhesive film. Accordingly, when the entire assembly is subsequently processed in a wave solder machine or drag soldering equipment, reliable electrical connection between the contacts 22 of the connector 2 and the metal contact pads of the PCB is produced. Furthermore, when said entire assembly is cooled, heated air can be quickly dissipated out through the first, second and third holes 302, 303, 309 of the pick up cap 3. That is, said entire assembly can be quickly cooled. The efficiency of mounting of the connector 2 onto the PCB is thereby enhanced.

In the above-described embodiment, two generally rectangular first holes 302 are defined in each of the opposite lateral sides of the planar body 30. Two generally rectangular second holes 303 are defined in the front end of the planar body 30. Two generally rectangular third holes 309 are defined in the rear end of the planar body 30, each third hole 309 being located nearer an outer side of the planar body 30 than both of the corresponding second holes 302. Each second hole 303 is larger than each of the first and second holes 302, 309. It should be understood that the numbers, shapes, sizes and locations of the first, second and third holes 302, 303, 309 may be varied. For example, each of the first, second and third holes 302, 303, 309 may be triangular, trapezoidal or circular. Additionally, the first, second and third holes 302, 303, 309 may have different shapes from each other. Furthermore, two or all of the first, second and third holes 302, 303, 309 may have the same size. The numbers, shapes, sizes and locations of the first, second and third holes 302, 303, 309 can be configured according to the requirements of each particular application.

From the foregoing it will be recognized that the principles of the invention may be employed in various arrangements to obtain the features, advantages and benefits described above. It is to be understood, therefore, that even though numerous characteristics and advantages of the invention have been set forth together with details of the structure and function of the invention, this disclosure is to be considered as illustrative only. Various changes and modifications may be made in detail, especially in matters of size, shape and arrangements of parts, without departing from the spirit and scope of the invention as defined by the appended claims.

What is claimed is:

1. An electrical connector assembly comprising:
    an electrical connector adapted for being mounted onto a circuit substrate by surface mount technology (SMT), the connector comprising:
    an insulative housing with a plurality of electrical contacts disposed therein;
    a pick up cap engagingly mounted above a top portion of the connector, the pick up cap having a planar body, the planar body having a planar top surface adapted for being engaged by a vacuum suction device and a bottom surface with a plurality of latches downwardly extending therefrom, and a plurality of holes defined in the planar body and extending through both the top surface and the bottom surface, and
    the holes are categorized with first and second groups wherein the holes in the first group are formed essentially as heat dissipation vias and unrelated to latches of the pick up cap, and the hole in the second group are for use during molding for forming the corresponding latches which are essentially aligned therewith in a vertical direction perpendicular to said planar body; wherein
    said connector includes a metal clip on a top portion thereof, which is provided for receiving said cap thereon; wherein
    said clip is curvilinear so as to provide a distance in the vertical direction with regard to the holes in the first group.

2. An electrical connector assembly comprising:
    an electrical connector adapted for being mounted onto a circuit substrate by surface mount technology (SMT), the connector comprising:
    an insulative housing defining a plurality of passageways;
    a plurality of electrical contacts received in corresponding passageways respectively;
    a metal stiffener partly covering the housing;
    a lever pivotably received in an end of the stiffener; and
    a curvilinear metal clip pivotably mounted to an opposite end of the stiffener for engaging with the lever; and
    a pick up cap engagingly mounted to a top portion of the clip and a gap defined between a bottom surface of the pick up cap and the clip, the pick up cap having a planar body, the planar body having a plane top surface adapted for being engaged by a vacuum suction device and a bottom surface, and at least three generally rectangular holes defined in and through the planar body, the holes providing to be formed essentially as heat dissipation vias and to be unrelated to retaining structures of the pick up cap during mounting the connector assembly onto the circuit substrate by SMT.

3. The electrical connector assembly as claimed in claim 2, there are four pairs of the holes defining in the planar body of the pick up cap.

4. The electrical connector assembly as claimed in claim 3, wherein two pairs of the holes are defined in opposite lateral sides of the planar body.

5. The electrical connector assembly as claimed in claim 3, wherein a pair of the holes is defined in a front end of the planar body.

6. The electrical connector assembly as claimed in claim 3, wherein a pair of the holes is defined in a rear end of the planar body.

7. The electrical connector assembly as claimed in claim 3, wherein two pairs of clasps are formed at opposite sides of a front end and a rear end of the planar body of the pick up cap respectively, the clasps snappingly clasping a corresponding edges of the clip of the connector.

8. The electrical connector assembly as claimed in claim 3, wherein the clip defines a generally rectangular window in a middle thereof, and the holes are in communication with the window when the pick up cap is mounted on the clip.

9. An electrical connector assembly comprising:
an electrical connector adapted for being mounted onto a circuit substrate by surface mount technology (SMT), the connector comprising:
an insulative housing with a plurality of electrical contacts disposes therein; and
a metal clip disposed on the housing, the clip being curvilinear and defining a generally rectangular window in a middle thereof; and
a pick up cap snappingly clasping a corresponding edge of the clip of the connector by a plurality of clasps formed on the pick up cap, the pick up cap having a planar top surface and a bottom surface opposite to the top surface, at least one channel defined portions of the pick up cap near the clasps to increase a resilience of the clasp, and a plurality of holes defined in the pick up cap and extending through both the top surface and the bottom surface, wherein
the holes formed essentially as heat dissipation vias and to be unrelated to retaining structures of the pick up cap to be used during mounted the connector assembly onto the circuit substrate by SMT.

10. The electrical connector assembly as claimed in claim 9, wherein the holes are located around a peripheral area of the pick up cap.

11. The electrical connector assembly as claimed in claim 9, wherein a through opening is defined in a portion of the pick up cap near one of the clasps formed at a front end of the pick up cp, and the openings are for use with, during molding, forming the corresponding clasps.

* * * * *